United States Patent
Geiger et al.

(10) Patent No.: US 8,258,590 B2
(45) Date of Patent: Sep. 4, 2012

(54) METHOD FOR THE PRODUCTION OF A COMPONENT, AND COMPONENT

(75) Inventors: Wolfram Geiger, Freiburg (DE); Uwe Breng, Gundelfingen (DE)

(73) Assignee: Northrop Grumman LITEF GmbH, Freiburg (DE)

( * ) Notice: Subject to any disclaimer, the term of this patent is extended or adjusted under 35 U.S.C. 154(b) by 268 days.

(21) Appl. No.: 12/451,942

(22) PCT Filed: Mar. 28, 2008

(86) PCT No.: PCT/EP2008/002503
§ 371 (c)(1),
(2), (4) Date: Dec. 8, 2009

(87) PCT Pub. No.: WO2009/003542
PCT Pub. Date: Jan. 8, 2009

(65) Prior Publication Data
US 2010/0117166 A1    May 13, 2010

(30) Foreign Application Priority Data
Jun. 29, 2007  (DE) .................. 10 2007 030 121

(51) Int. Cl.
*H01L 29/84* (2006.01)

(52) U.S. Cl. ......... 257/415; 257/E21.001; 257/E29.324; 257/420; 438/51

(58) Field of Classification Search .............. 257/415, 257/619, E21.502, E29.324, 416, 417, 419, 257/420, E21.001; 438/51, 459, 53
See application file for complete search history.

(56) References Cited

U.S. PATENT DOCUMENTS

| | | | |
|---|---|---|---|
| 5,959,206 A * | 9/1999 | Ryrko et al. ............ | 73/504.12 |
| 6,635,509 B1 * | 10/2003 | Ouellet ................... | 438/106 |
| 2004/0104444 A1 | 6/2004 | Wachtmann | |
| 2004/0232110 A1 * | 11/2004 | Hsieh et al. ............. | 216/58 |
| 2007/0128831 A1 * | 6/2007 | Oka et al. ............... | 438/459 |

FOREIGN PATENT DOCUMENTS

| | | |
|---|---|---|
| DE | 19961578 | 6/2001 |
| DE | 102005015584 | 10/2006 |
| EP | 1405821 | 4/2004 |
| WO | 9533282 | 12/1995 |

* cited by examiner

*Primary Examiner* — Minh-Loan T Tran
*Assistant Examiner* — Fazli Erdem
(74) *Attorney, Agent, or Firm* — Elliott N. Kramsky

(57) ABSTRACT

A method for producing a component, especially a micromechanical, micro-electro-mechanical or micro-opto-electromechanical component, as well as such a component which has an active structure that is embedded in a layer structure. Strip conductor bridges are formed by etching first and second depressions having a first and second, different etching depth into a covering layer of a first layer combination that additionally encompasses a substrate and an insulation layer. The deeper depression is used for insulating the strip conductor bridge while the shallower depression provides a moving space for the active structure with the moving space being bridged by the strip conductor bridge.

35 Claims, 5 Drawing Sheets

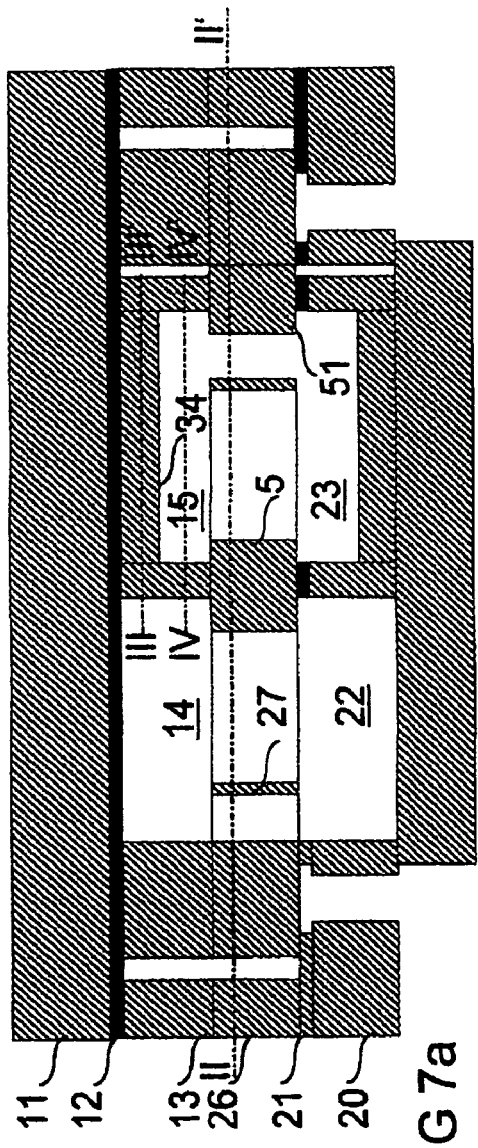
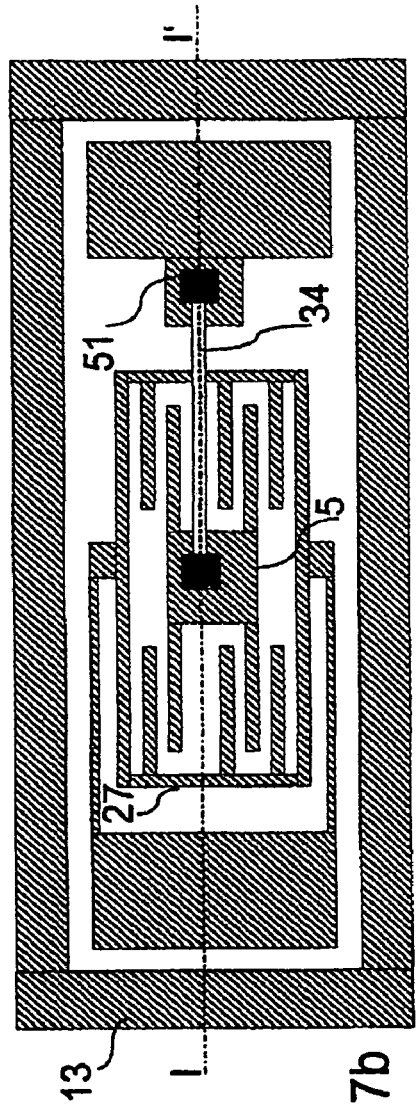
FIG 7a
FIG 7b

METHOD FOR THE PRODUCTION OF A COMPONENT, AND COMPONENT

BACKGROUND

1. Field of the Invention

The invention relates to micromechanical, micro-electromechanical (MEMS) or micro-opto-electromechanical (MOEMS) components. More particularly, this invention pertains to a method of manufacture of such a component as well as the resultant component.

2. Description of the Prior Art

Active structures of micro-electromechanical components (MEMS) or micro-opto-electromechanical components (MOEMS) are often hermetically encapsulated to minimize environmental influences such as moisture and contaminants (e.g. dust). ("Active structure" should be understood to mean, in particular, movable structures, optical structures or structures having both movable and optical components such as movable mirrors. The term "active region" denotes the region or volume of the component in which the active structure lies or moves.) Hermetic encapsulation can also be employed to set a specific internal pressure in the region of the active structures. This is particularly advantageous in components whose functioning is dependent on a defined internal pressure (e.g. acceleration sensors and gyroscopes (rate-of-rotation sensors)). Fabrication of MEMS or MOEMS components generally takes place at the wafer level so that production can be implemented as cost-effectively as possible. Joining processes that are often carried out can be performed, for example, on the basis of direct and anodic bonding processes.

Leading electrical contacts out from the hermetically tight region of the component to make contact with specific parts of the component (e.g. the active structure) is difficult from the standpoint of fabrication. Various possibilities exist. Electrical contacts can be realized, for example, by laterally extending semiconductor layers produced by implantation or diffusion methods that have a low sheet resistance. It is additionally possible to accomplish this by means of patterned conductive layers covered with a planarized passivation layer. Alternatively, the electrical contacts can be led out from the component through a plurality of vertically extending plated-through holes.

DE 102005015584 describes a method for production of a component in which the active region and, hence, the active structure, of the component is isolated from the environment (as far as contaminants and moisture are concerned) before contact holes are made. Electric current required for operation and signals generated by the active structure are respectively fed to the active structure and tapped off via the contact holes and the adjacent conductive structure layer. However, this does not permit any crossover of interconnects. In particular, it is not possible to make contact with regions (e.g. electrodes) lying within a movable structure that is closed (in a component layer plane) with a tolerably small area requirement. Therefore, the movable structures 6 in MEMS 2 realized by this technology often have openings 3 for the interconnects 4 to electrodes 5 (see FIG. 3).

SUMMARY AND OBJECTS OF THE INVENTION

It is therefore the object of the invention to provide a method for producing a component, in particular a micromechanical, micro-electromechanical or micro-opto-electromechanical component, of the type in which interconnect crossovers and, in particular, bridges over movable structures, are realized.

The foregoing and other disadvantages of the prior art are addressed by the present invention that provides, in a first embodiment, a method for producing a micromechanical, micro-electromechanical or micro-opto-electromechanical component.

Such method is begun by producing a first layer assembly which has a first substrate, a first insulation layer on the first substrate and an at least partly conductive covering layer on the first insulation layer.

First and second depressions are produced in the covering layer. The first depressions have a first etching depth and the second depressions have a second etching depth that is smaller than the first etching depth. The first etching depth is at least equal to the thickness of the covering layer. An at least partly conductive structure layer is applied to the covering layer so the structure layer adjoins, at least regions of, the covering layer.

In a second embodiment, the invention provides a micromechanical, micro-electromechanical or micro-opto-electromechanical component. Such component includes a first layer assembly that has a first substrate with a first insulation layer and a covering layer.

An at least partly conductive structure layer is arranged on the covering layer. First and second depressions are provided in the covering layer that proceed from an interface with the structure layer. The first depressions have a first etching depth and the second depressions have a second etching depth smaller than the first etching depth. The first etching depth is at least equal to the thickness of the covering layer.

The preceding and other features of the invention will become further apparent from the detailed description that follows. Such description is accompanied by a set of drawing figures. Numerals of the drawing figures, corresponding to those of the detailed written description, point to the features of the invention. Like numerals refer to like features of the invention throughout.

BRIEF DESCRIPTION OF THE DRAWINGS

FIGS. 7a and 7b are sectional elevation and top plan views, respectively, illustrating a component with an interconnect bridge along the sectional area I-I' (FIG. 7b), and a component along the sectional area II-II' superimposed by a section along the area III-III' (FIG. 7a, light gray shade) and along the area IV-IV' (FIG. 7a, dark gray shade).

DETAILED DESCRIPTION OF THE PREFERRED EMBODIMENT

In the invention, a cover wafer 10, in particular an SOI (Silicon on Insulator) wafer, may be employed (e.g., for a first layer assembly). Such a wafer is patterned by a two-stage patterning step such as a two-stage dry etching step (DRIE: Deep Reactive Ion Etching) using a double mask. In such case, the SOI wafer 10 comprises a first silicon substrate 11, a first insulation layer 12 (generally silicon dioxide), and a covering layer 13 that is isolated from the first substrate 11 by the buried first insulation layer 12.

Figure 1:
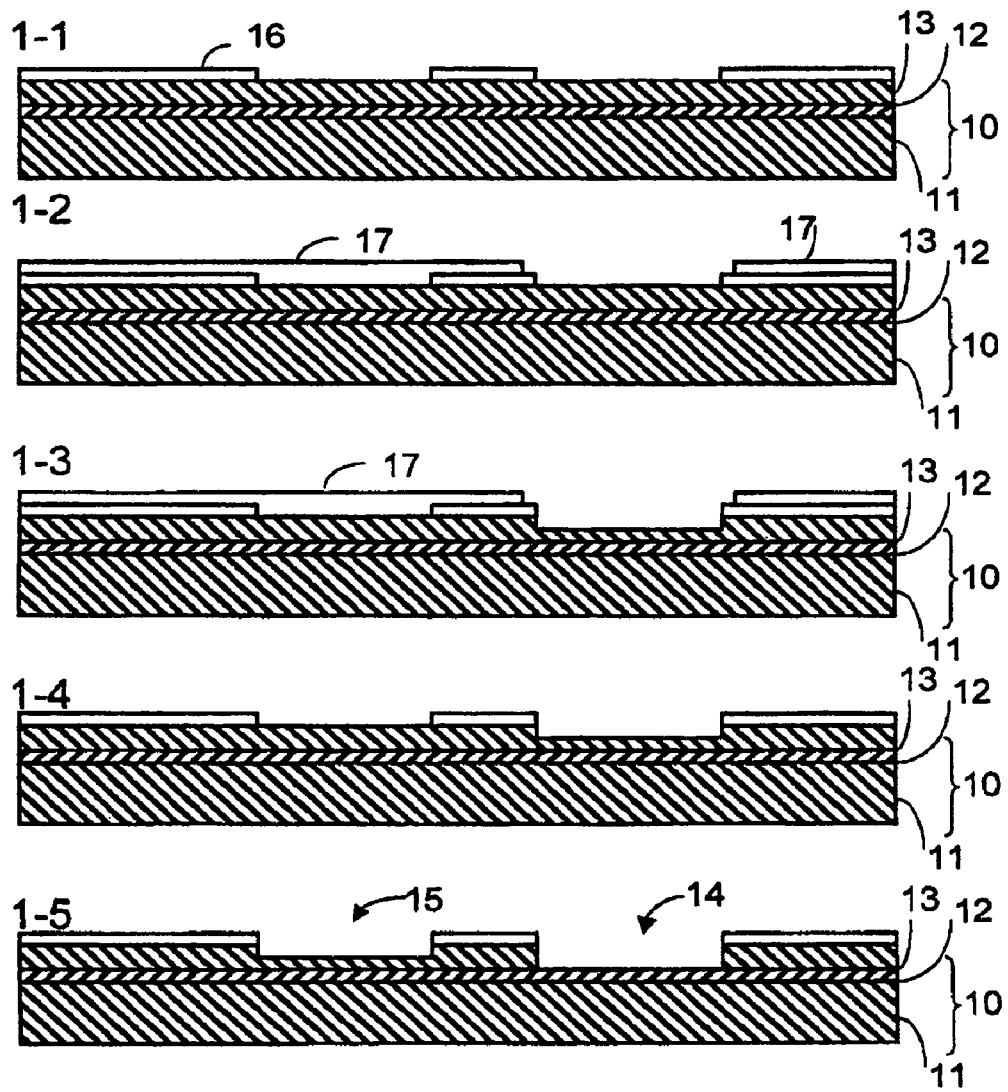
FIG. 1 is a series of side sectional views that illustrate steps 1-1, 1-2, 1-3, 1-4 and 1-5 for patterning depressions having different etching depths with the aid of a double mask.

FIG. 1 is a series of cross-sectional views that illustrate how a first depression 14 of first etching depth D1 and a second depression 15 of second etching depth D2 are created (the result illustrated by step 1-5). An oxide layer 16 is initially created on the SOI wafer 10 and patterned (step 1-1). A layer of photoresist 17 is then applied, exposed and developed (step 1-2). Regions are etched in the silicon of the covering layer 13 that have openings at the same location in the oxide layer 16 and in the photoresist mask 17 (i.e., at the lateral position of the subsequent first depression 14 (step 1-3)). After this first patterning step, the photoresist 17 is removed (step 1-4). Openings in the oxide layer 16 previously covered with photoresist 17 are uncovered in the process. In a second patterning step, such regions and regions already patterned in the first patterning step are etched into the silicon of the covering layer 13. Following the two etching steps, the regions of the first depressions 14 that had already been patterned in the first patterning step are opened down to the buried oxide 12 of the SOI wafer to enable electrical insulation of separate electrodes. The depth of the second etching step determines the distance between a bridge and the movable structure (or the interconnect in the structure layer 26) (step 1-5), as can be seen with reference to FIG. 2. The buried oxide 12 acts as an etching stop.

The oxide 16 is then removed. Since the silicon surface lying beneath the oxide 16 is bonded later, removal is preferably accomplished wet-chemically. The buried oxide 12 at the bottom of the first depressions 14 is also wholly or partly removed (see FIG. 2-1). This does not have a disadvantageous effect on function. The cover wafer 10 then has the structure illustrated in FIG. 2-1 with first depressions 14 of a first etching depth D1 that corresponds to the thickness of the covering layer 13 and, thus, extend at least down to the buried oxide 12, and with second depressions 15 of a second etching depth D2 that is smaller than the first etching depth D1.

A patterned second insulation layer 21 is then produced on the surface of a second substrate 20. Afterward, third depressions 22 having a third etching depth D3 and fourth depressions 23 having a fourth etching depth D4 are produced in the surface of the second substrate 20. The widths B1 of the third depressions 22 are narrower than the widths B2 of the cutouts of the second insulation layer 21 above the third depressions 22. In this way, break-off edges 24 occur in the regions that border the third depressions 22, whose function will be described later.

A structure layer 26 is applied to the insulation layer 21 to produce a second layer assembly 25 in a next process step. The structure layer 26 bears on the individual regions of the second insulation layer 21.

Figure 2:
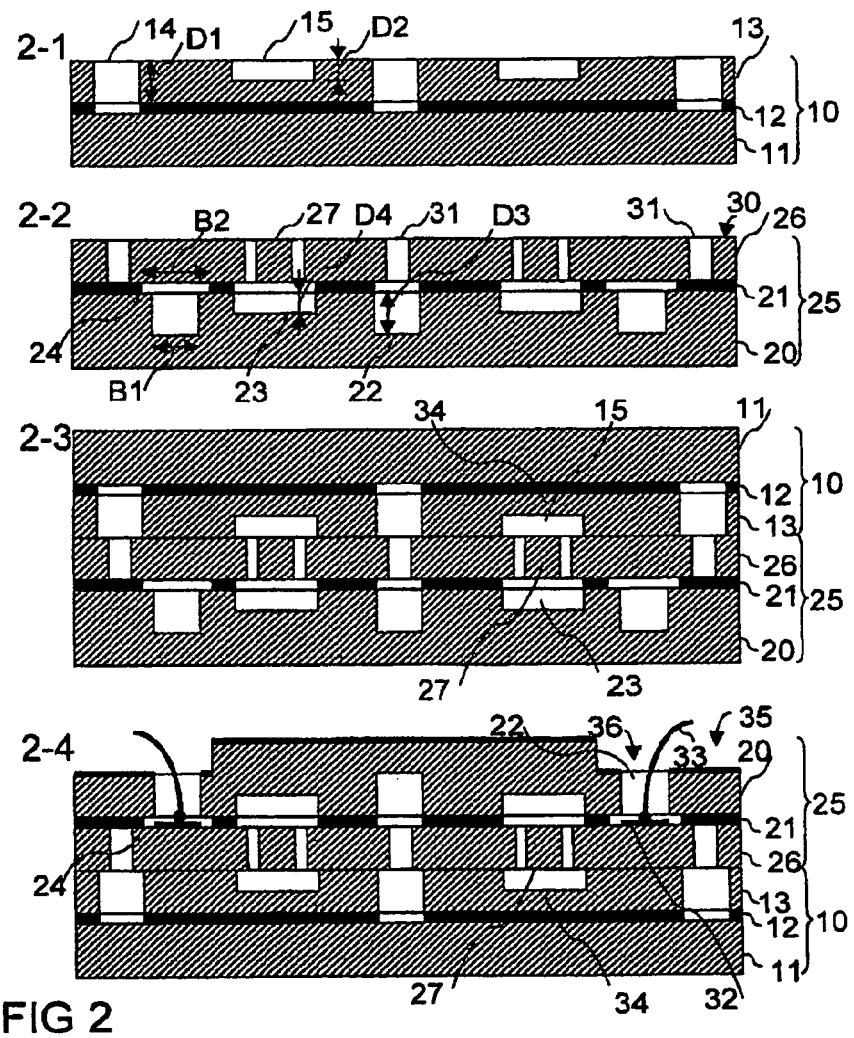
FIG. 2 is a series of side sectional views that illustrate the method of the invention according to steps 2-1, 2-2, 2-3 and 2-4.

In a following step, the structure layer 26 is patterned to form an active structure 27 wherein outer regions 30 (the chip edge, i.e., the edge region of the component to be produced) of the structure layer 26 are electrically insulated from the conductive regions "within" the component by trenches 31. The resultant structure is illustrated in FIG. 2-2.

The first layer assembly 10 and the second layer assembly 25 are then joined together so that the covering layer 13 adjoins the structure layer 26 and the second depressions 15 and the fourth depressions 23 are located respectively above and below the active structure 27. Not illustrated, but likewise desired in part, is the fact that at least a portion of the first depressions 14 and of the third depressions 22 are also situated respectively above and below the active structure 27.

During bonding of the first layer assembly 10 onto the second layer assembly 25 "SOI with buried cavities", silicon is bonded onto a silicon, rather than a silicon being bonded onto oxide. Besides the hermetically tight mechanical bond, a connection of lowest possible electrical resistance is produced.

In a following process step, a bonding pad region 35 of the second substrate 20 is etched back to a vertical position corresponding to the vertical position of the bottoms of the third depressions 22, uncovering the third depressions 22 and creating contact holes 36.

In the next step, a metallization layer is deposited on the surface of the second substrate 20. Due to the presence of the break-off edges 24, the part of the metallization layer deposited within the third depressions 22 is electrically isolated from the rest of the metallization layer. As a result, metal contact-making areas 32 are created within the third depressions 22. Thereafter, contact is made with the metal contact-making areas 32 by bonding wires 33, creating the structure of FIG. 2-4.

If desired, in a further process step, an additional metallization layer (not illustrated) can be deposited on the surface of the first substrate 11 remote from the structure layer 26. The added metallization layer as well as the metallization layer serve as shielding electrodes for shielding undesirable electromagnetic fields. The two metallization layers can be connected to a defined, common potential or to different potentials.

Accordingly, the invention discloses a method for producing micro-electromechanical or micro-opto-electromechanical components, in particular components having hermetically encapsulated active structures and areas for making electrical contact. The production method of the invention enables hermetically tight encapsulation of specific regions of the structure layer at the wafer level with an adjustable internal pressure. It also affords the possibility of connecting the electrodes 5 in the structure layer by interconnect bridges 34 over active structures 27 (shown, for example in FIG. 2-4) without openings 3 as illustrated by the prior art interconnect structure of FIG. 3. As a result, it is possible to produce structures 1 as illustrated in FIG. 4 in which the electrodes 5 can be contact-connected via the interconnect bridges 34 (not shown) and, thus, the structures 1 are not interrupted in comparison with the open structures 6 in FIG. 3.

In order to insulate the conductive material of the second substrate, use is advantageously made of break-off edges 24 that bring about electrical isolation of the conductive sidewalls of the contact hole 36 from the bottom of the contact hole, with the bottom being connected (often directly) to an electrode of the component.

Metallization of the contact regions is performed only after the conclusion of all the joining processes. It is thus possible to use methods such as, for example, silicon direct bonding (SDB) with temperature loads of greater than 400° C. provided that no doped active regions exist within the structure layer 26 whose doping profiles could be impaired at relatively high temperatures.

The invention can be applied to production of any (miniaturized) components, in particular for a micromechanical, micro-electromechanical or micro-opto-electromechanical component (e.g., acceleration sensors, rate-of-rotation sensors, pressure sensors, optical couplers, etc.)

Figure 3:
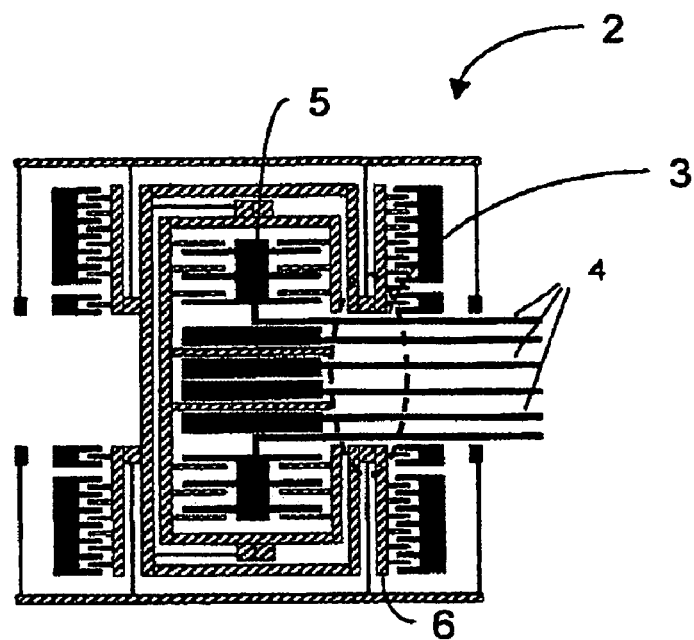
FIG. 3 is a schematic plan view of a micromechanical sensor structure with openings for interconnects in accordance with the prior art.
Figure 4:
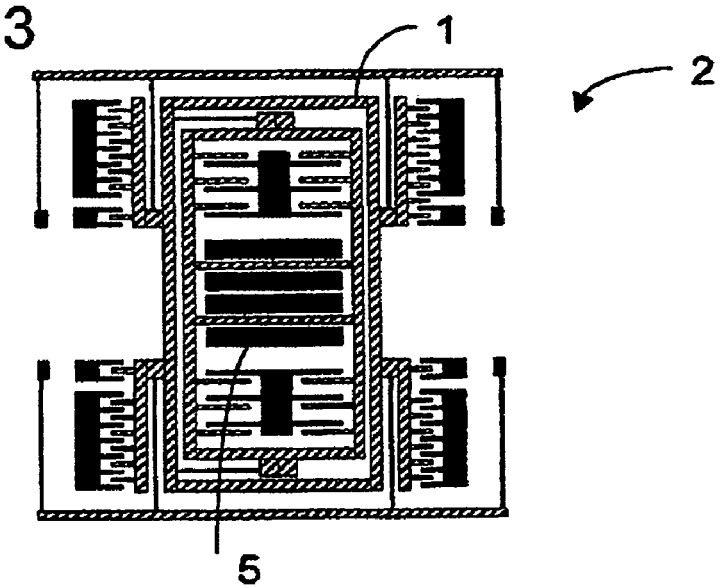
FIG. 4 is a schematic plan view of a sensor structure produced in accordance with the method of the invention.

FIGS. 2-2 to 2-4 illustrate the optional case in which the second substrate 20 is also patterned by means of a two-stage DRIE step (before completion of the structure layer 26). In this case, the first etching depth D1 and the third etching depth D3 are chosen to be identical while the second etching depth D2 is chosen to be identical to the fourth etching depth D4. This has the advantage of symmetrical gas surroundings of the active structure 27. It substantially suppresses the resulting damping forces perpendicular to the wafer plane and parasitic movements resulting therefrom.

If there is no need for hermetically tight encapsulation of the structures in the structure layer 26, the structure layer 26 can be formed on the described first layer assembly 10 by means of SDB (Silicon Direct Bonding) and can be patterned (after the formation of bonding pads e.g. by aluminum sputtering and etching).

It is also possible to form a structure layer 26 on the above-described first layer assembly 10 and to subsequently pattern it. It is subsequently possible to form an encapsulation by means of an encapsulation layer (e.g. a second substrate 20) by SDB, anodic bonding, anodic bonding with e.g. a sputtered PYREX interlayer or other joining methods. In this case, the encapsulation layer (e.g. the layer 20) can be pre-patterned to insure access to the metal contact-making areas 32. This embodiment creates cross sections similar or identical to those shown in FIG. 2-4. In this way, the metal contact-making areas 32 can be applied to the structure layer 26 prior to encapsulation, and the active structure 27 can be tested. Low-temperature joining methods should then be used for the last joining process to prevent the metal contact-making areas 32 from being destroyed.

Figure 5:
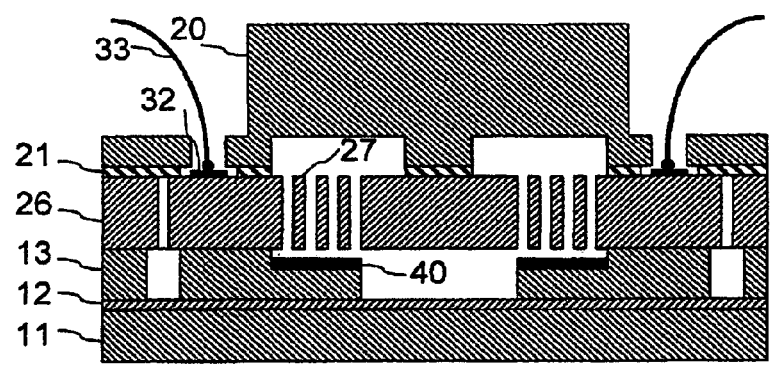
FIG. 5 is a sectional elevation view of a component with a buried electrode.

FIG. 5 is a sectional elevation view of a component with buried electrodes. This demonstrates that the two-stage patterning process can also form buried electrodes 40 that can be employed primarily to detect and impress movements and forces in the z direction (perpendicular to the wafer plane).

Figure 6:
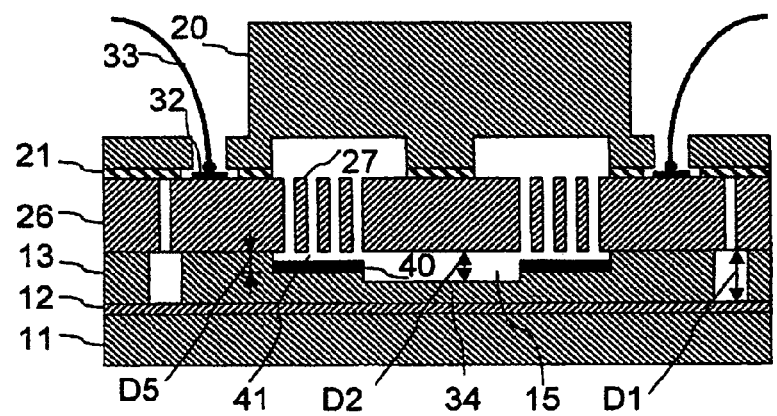
FIG. 6 is a sectional elevation view of a component with a buried electrode and an interconnect bridge.

As is illustrated in FIG. 6, it is possible to form both buried electrodes 40 and interconnect bridges 34 by a three-stage patterning with fifth depressions 41 of a fifth etching depth D5. In this case, the buried electrodes 40 are formed, for example, by the material of the corresponding layer (the covering layer 13) itself, or by deposition of an additional metallization layer on the corresponding layer (the covering layer 13).

FIG. 7a illustrates a schematic section taken along the sectional area I-I' of FIG. 7b, while FIG. 7b illustrates a schematic cross section taken along the sectional area II-II' of FIG. 7a, superimposed by a section along the area of FIG. 7a (light gray shade) and a section along the area IV-IV' of FIG. 7a (dark gray shade). In this case, the cross section of FIG. 7b illustrates particularly well the active structure 27 and the interconnect bridge 34 that connects an electrode 5 situated within the active structure to a connection 51 outside the active structure. In this case, the illustrated component also illustrates the fact that a portion of the first depressions 14 and of the third depressions 22 as well as the second depressions 15 and the fourth depressions 23 are situated symmetrically above and below the active structure respectively. In a symmetrical arrangement resulting from identical etching depths of the second and fourth depressions 15, 23 and of the first and third depressions 14, 22, symmetrical gas environments of the movable active structure 27 occur. This substantially suppresses the resulting damping forces perpendicular to the plane of the layers and the resulting parasitic movements.

In the invention, interconnect bridges are formed by different etching depths with structures being bridged by the interconnect bridges. The method of the invention increases design freedom and variety since new structures become possible. By eliminating openings, a stiffer structure is achieved. This leads to the reduction of parasitic movements and effects. Moreover, the number of bonding pads can be reduced, giving rise to lower costs due to a smaller area requirement and an increase in yield or reliability.

In a preferred embodiment, the active structure of the component is produced by patterning the structure layer, where the patterning can be accomplished before or after application of the structure layer to the first layer assembly. The patterning can be accomplished, for example, by applying a mask on the surface of the structure layer and subsequently etching that layer. If the structure layer is not patterned until after application, then it is not necessary to take any joining tolerances into account during application of the structure layer.

In accordance with further advantageous embodiments, application of an encapsulation layer, or of a second layer assembly, enables hermetically tight encapsulation at the wafer level with adjustable internal pressure. It simultaneously affords the possibility of producing a shield electrically insulated from the other electrical contacts for protection against external electromagnetic interference fields. In this case, the structure layer can also be part of the second layer assembly which also includes a second substrate and a second insulation layer. Simple access to the metal contact-making areas through the encapsulation layer can be accomplished by contact holes produced in the encapsulation layer before application of the encapsulation layer to the structure layer.

When using the second layer assembly, preferably in the side of the second substrate facing the structure layer, before application of the structure layer to the second layer assembly, third depressions are produced. The lateral positions of the third depressions correspond, at least in part, to those of the contact holes formed later in the second substrate. The third depressions can be used as contact holes (or at least as parts of the contact holes) in a later process stage of the production method of the invention.

Fourth depressions are produced, in the side of the second substrate facing the structure layer, before application of the structure layer to the second layer assembly. The lateral positions of the fourth depressions correspond, at least in part, to those of the active structure or the active structure of the structure layer. The second depressions can likewise be produced at these lateral positions. The second and fourth depressions enable mechanical movement (e.g. vibration) of that region of the structure layer that lies within the active region. Also, the second and fourth depressions can be used to establish specific parameters of the component. Since mechanical vibration quality under specific conditions is dependent primarily on the pressure enclosed into the component, the geometry of the active (movable) structure and the direct surroundings, it is possible, for example, to influence the vibration quality of a vibratory active structure in a targeted way through the depths of the second and fourth depressions. Thus, vibration quality is greater the deeper the second and fourth depressions (for the same pressure within the component).

In the case of a symmetrical arrangement (as a result of identical etching depths of the second and fourth depressions), symmetrical gas surroundings of the movable active structure result. This substantially depresses resulting damping forces perpendicular to the plane of the layers and the parasitic movements that result.

If third depressions have been formed within the second substrate, it is then possible, in order to form the contact holes, to remove at least part of the second substrate as far as a vertical position corresponding to the vertical position of the bottoms of the third depressions proceeding from the surface of the second substrate remote from the structure layer. The third depressions are thus "opened" and available as contact holes.

It is also possible for a portion of the first depressions and a portion of the third depressions to be located above and below the active structure respectively. In a particularly preferred embodiment, the first and second substrates as well as the structure layer and the covering layer, are composed of silicon. However, the invention is not limited thereto as other materials/material combinations are also within the scope of the invention. Silicon generally possesses the advantages of good mechanical properties, high availability and well-developed processing methods. If the components mentioned above are composed of silicon, then this offers the advantages of low thermal stress (always present if the two substrates and the covering and structure layers are composed of the same material) and also little outgassing during thermal joining (compared with PYREX or SD2 (materials commercially available from Corning Glas and Hoya respectively)), whereby pressures of less than 0.01 mbar can be obtained within the component.

The different etching depths can be produced by a two-stage dry etching step using a double mask. By producing electrodes for the active structure at the positions of the second depressions in/on the covering layer, it is possible to form buried electrodes that can be used to detect and impress movements and forces perpendicular to the wafer plane. Both buried electrodes and interconnect bridges can be formed jointly in one component by a three-stage etching process.

Thus it is seen that the present invention provides a method for producing a component, in particular, a micromechanical, micro-electromechanical or micro-opto-electromechanical component of the type in which interconnect crossovers and, in particular, bridges over movable structures, are realized.

While this invention has been described with references to its presently-preferred embodiment, it is not limited thereto. Rather, the invention is limited only insofar as it is defined by the following set of patent claims and includes within its scope all equivalents thereof.

What is claimed is:

1. A method for producing a component, in particular a micromechanical, micro-electromechanical or micro-opto-electromechanical component, comprising the following steps:
   production of a first layer assembly, which has a first substrate, on the latter a first insulation layer and on the latter an at least partly conductive covering layer,
   after producing the first layer assembly, production of first depressions and second depressions in the covering layer, wherein the first depressions have a first etching depth and the second depressions have a second etching depth, which is smaller than the first etching depth and smaller than the thickness of the covering layer, and the first etching depth is at least equal to the thickness of the covering layer,
   after producing the first and second depressions, application of an at least partly conductive structure layer to the covering layer, in such a way that the structure layer adjoins the covering layer on that side of the covering layer, in which the second depressions are produced, and at least in regions.

2. The method for producing a component as claimed in claim 1,
characterized in that
   an active structure of the component is produced by patterning the structure layer, wherein the patterning is effected before or after the application of the structure layer to the covering layer.

3. The method for producing a component as claimed in claim 2, characterized in that metal contact-making areas are produced in regions on the surface of the structure layer opposite to the covering layer.

4. The method for producing a component as claimed in claim 2, characterized in that an encapsulation layer for encapsulating the active structure is applied to the surface of the structure layer opposite to the covering layer.

5. The method for producing a component as claimed in claim 4, characterized in that the encapsulation layer, before being applied to the covering layer, is provided with contact holes that enable access to the metal contact-making areas after the encapsulation layer has been applied to the covering layer.

6. The method for producing a component as claimed in claim 1, characterized in that the structure layer is applied to the covering layer by means of the following steps:
   production of a second layer assembly, which comprises a second substrate and a second insulation layer, which covers at least part of the surface of the second substrate,
   application of the structure layer to the second insulation layer, and
   application of the second layer assembly to the covering layer in such a way that the structure layer adjoins the covering layer at least in regions.

7. The method for producing a component as claimed in claim 6, characterized in that an active structure of the component is produced by patterning the structure layer, wherein the patterning is effected before or after the application of the structure layer to the second layer assembly.

8. The method for producing a component as claimed in claim 7, characterized in that the first and the second layer assemblies and also the structure layer are configured such that after the application of the second layer assembly, at least a part of the structure layer which comprises the active structure is hermetically tightly sealed by the first and second layer assemblies.

9. The method for producing a component as claimed in claim 6, characterized in that contact holes are formed in the second substrate.

10. The method for producing a component as claimed in claim 9 characterized in that in the side of the second substrate facing the structure layer, before the application of the structure layer to the second layer assembly, third depressions are produced, the lateral positions of which correspond at least in part to the lateral positions of the contact holes that are formed later in the second substrate.

11. The method as claimed in claim 9, characterized in that in the side of the second substrate facing the structure layer, before the application of the structure layer to the second layer assembly, fourth depressions are produced, the lateral positions of which correspond at least in part to the lateral positions of the active structure of the structure layer.

12. The method as claimed in claim 2, characterized in that the second depressions produced in the covering layer and/or the first depressions are produced at lateral positions which correspond at least in part to the lateral positions of the active structure of the structure layer.

13. The method as claimed in claim 11, characterized in that
the etching depth of the fourth depressions is chosen to be at least approximately equal to the second etching depth of the second depressions of the covering layer.

14. The method as claimed in claim 1, characterized in that the first substrate, if appropriate second substrate and also the structure layer and the covering layer are composed of the same material, in particular silicon.

15. The method as claimed in claim 1, characterized in that the different first and second etching depths of the first depressions and second depressions and/or the different third and fourth etching depths of the third depressions and fourth depressions are produced by means of a two-stage dry etching step by means of a double mask.

16. The method as claimed in claim 1, characterized in that electrodes for the active structure are produced at the positions of the second depressions in/on the covering layer.

17. The method as claimed in claim 1, characterized in that fifth depressions having a fifth etching depth, which differs from the first etching depth and the second etching depth, are realized in the covering layer, and in that electrodes for the active structure are produced at the positions of the fifth depressions in/on the covering layer.

18. The method as claimed in claim 1, characterized in that an interconnect bridge is produced in the covering layer by means of the method, said interconnect bridge connecting an electrode within the active structure to the structure layer outside the active structure.

19. A micromechanical, micro-electromechanical or micro-opto-electromechanical component, comprising:
a first layer assembly, which has a first substrate, on the latter a first insulation layer and on the latter a covering layer,
an at least partly conductive structure layer arranged on the covering layer, and
first depressions and second depressions in the covering layer, said depressions proceeding from an interface with the structure layer, wherein the first depressions have a first etching depth and the second depressions have a second etching depth, which is smaller than the first etching depth and smaller than the thickness of the covering layer, and the first etching depth is at least equal to the thickness of the covering layer.

20. The micromechanical, micro-electromechanical or micro-opto-electromechanical component as claimed in claim 19, characterized in that an active structure of the component is formed by patterning the structure layer.

21. The component as claimed in claim 20, characterized by metal contact-making areas on the surface of the structure layer opposite to the covering layer.

22. The component as claimed in claim 20, characterized by
an encapsulation layer for encapsulating the active structure on the surface of the structure layer opposite to the covering layer.

23. The component as claimed in claim 21, characterized by an encapsulation layer for encapsulating the active structure on the surface of the structure layer opposite to the covering layer, and contact holes in the encapsulation layer for enabling access to the metal contact-making areas.

24. The component as claimed in claim 19,
characterized by a second layer assembly, which has a second substrate and a second insulation layer, which covers at least part of the surface of the second substrate, wherein the second layer assembly is arranged on the side of the structure layer opposite to the covering layer.

25. The component as claimed in claim 24, characterized in that an active structure of the component is formed by patterning the structure layer.

26. The component as claimed in claim 25, characterized in that the first and the second layer assemblies and also the structure layer are configured such that a part of the structure layer which comprises the active structure is hermetically tightly sealed by the first and second layer assemblies.

27. The component as claimed in claim 24, characterized in that contact holes are formed in the second substrate.

28. The component as claimed in claim 27, characterized in that in the side of the second substrate facing the structure layer, third depressions are present, the lateral positions of which correspond at least in part to the lateral positions of the contact holes.

29. The component as claimed in claim 27, characterized in that
in the side of the second substrate facing the structure layer, fourth depressions are present, the lateral positions of which correspond at least in part to the lateral positions of the active structure of the structure layer.

30. The component as claimed in claim 25, characterized in that
the second depressions present in the covering layer and/or the first depressions are at lateral positions which correspond at least in part to the lateral positions of the active structure of the structure layer.

31. The component as claimed in claim 29, characterized in that
a fourth etching depth of the fourth depressions is at least approximately equal to the second etching depth of the second depressions of the covering layer.

32. The component as claimed in claim 19, characterized in that
the first substrate, if appropriate second substrate and also the structure layer and the covering layer are composed of the same semiconductor material, in particular silicon.

33. The component as claimed in claim 19, characterized by
electrodes in/on the covering layer at the positions of the second depressions.

34. The component as claimed in claim 19, characterized by
fifth depressions having a fifth etching depth in the covering layer and by electrodes in/on the covering layer at the positions of the fifth depressions.

35. The component as claimed in claim 19, characterized in that
at least one interconnect bridge is formed in the covering layer, said at least one interconnect bridge connecting an electrode within the active structure to the structure layer outside the active structure.

* * * * *